United States Patent
Liu et al.

(10) Patent No.: US 11,534,762 B2
(45) Date of Patent: Dec. 27, 2022

(54) MICROFLUIDIC DEVICE, METHOD OF USING MICROFLUIDIC DEVICE AND MICRO TOTAL ANALYSIS SYSTEM

(71) Applicant: BOE TECHNOLOGY GROUP CO., LTD., Beijing (CN)

(72) Inventors: Yingming Liu, Beijing (CN); Haisheng Wang, Beijing (CN); Xiaochuan Chen, Beijing (CN); Xue Dong, Beijing (CN); Xiaoliang Ding, Beijing (CN); Pinchao Gu, Beijing (CN); Lei Wang, Beijing (CN); Changfeng Li, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 650 days.

(21) Appl. No.: 16/420,760

(22) Filed: May 23, 2019

(65) Prior Publication Data
US 2020/0147612 A1 May 14, 2020

(30) Foreign Application Priority Data
Nov. 12, 2018 (CN) .......................... 201811340757.X

(51) Int. Cl.
*B01L 3/00* (2006.01)
*B81B 1/00* (2006.01)

(52) U.S. Cl.
CPC ... *B01L 3/502792* (2013.01); *B01L 3/502715* (2013.01); *B81B 1/006* (2013.01); *B01L 2400/0415* (2013.01); *B81B 2201/057* (2013.01); *B81B 2203/04* (2013.01); *B81B 2207/03* (2013.01)

(58) Field of Classification Search
CPC ......... B01L 3/502792; B01L 3/502715; B01L 2400/0415; B81B 1/006; B81B 2201/057; B81B 2203/04; B81B 2207/03
See application file for complete search history.

(56) References Cited

U.S. PATENT DOCUMENTS

| 9,211,512 B2 | 12/2015 | Kim et al. | |
| 2003/0164295 A1* | 9/2003 | Sterling | B01L 3/502792 |
| | | | 204/450 |
| 2018/0085756 A1* | 3/2018 | Kosaka | B01L 3/502792 |

FOREIGN PATENT DOCUMENTS

| CN | 102644049 A | 8/2012 |
| CN | 103852577 A | 6/2014 |
| CN | 108169966 A | 6/2018 |
| EP | 1935494 A1 | 8/2007 |

OTHER PUBLICATIONS

First Chinese Office Action from corresponding Chinese Patent Application No. 201811340757.X dated Aug. 7, 2020.

* cited by examiner

*Primary Examiner* — Robert J Eom
(74) *Attorney, Agent, or Firm* — Dilworth & Barrese, LLP.; Michael J. Musella, Esq.

(57) ABSTRACT

A microfluidic device, a method of using a microfluidic device and a micro total analysis system are provided. The microfluidic device includes a first substrate, and the first substrate includes a base substrate and a pixel array. The pixel array includes a plurality of pixels and is on the base substrate, and each of the plurality of pixels includes a driving electrode. Driving electrodes of two adjacent pixels are in different layers.

18 Claims, 4 Drawing Sheets

MICROFLUIDIC DEVICE, METHOD OF USING MICROFLUIDIC DEVICE AND MICRO TOTAL ANALYSIS SYSTEM

CROSS-REFERENCE TO RELATED APPLICATION

The present application claims priority of the Chinese Patent Application No. 201811340757.X, filed on Nov. 12, 2018, the entire text of which is incorporated by reference as part of the present application.

TECHNICAL FIELD

Embodiments of the present disclosure relate to a microfluidic device, a method of using a microfluidic device and a micro total analysis system.

BACKGROUND

Micro total analysis systems can control the movement, separation, polymerization, chemical reaction, biological detection and other operations of micro-fine droplets, in which microfluidic devices are mainly used to control the movement of the droplets. Microfluidic devices can drive discrete droplets and have the advantages of less consumption of samples and reagents, fast mixing speed, less cross contamination, easy manipulation, etc. With the development of biochemical technology, microfluidic devices and micro total analysis systems have received more and more attentions and been with more and more applications.

SUMMARY

At least one embodiment of the present disclosure provides a microfluidic device, which comprises a first substrate, and the first substrate comprises: a base substrate; and a pixel array on the base substrate, comprising a plurality of pixels, each of the plurality of pixels comprising a driving electrode, and driving electrodes of two adjacent pixels are in different layers.

For example, in the microfluidic device provided by an embodiment of the present disclosure, the plurality of pixels of the pixel array are arranged in a plurality of rows and a plurality of columns, driving electrodes of two adjacent pixels in each row are in different layers, and driving electrodes of two adjacent pixels in each column are in different layers.

For example, in the microfluidic device provided by an embodiment of the present disclosure, orthographic projections of the driving electrodes of the two adjacent pixels on the base substrate have an overlapping area or are connected at an adjacent edge.

For example, in the microfluidic device provided by an embodiment of the present disclosure, in four pixels forming a 2*2 matrix, driving electrodes of two pixels on a diagonal line are in a same layer.

For example, in the microfluidic device provided by an embodiment of the present disclosure, the driving electrodes of the two pixels on the diagonal line have a pitch.

For example, in the microfluidic device provided by an embodiment of the present disclosure, the driving electrode of each of the plurality of pixels has a notch, and orthographic projections of notches of the driving electrodes of the two adjacent pixels on the base substrate at least partially coincide.

For example, in the microfluidic device provided by an embodiment of the present disclosure, sizes of the notches of the driving electrodes of the two adjacent pixels are not equal.

For example, in the microfluidic device provided by an embodiment of the present disclosure, in the four pixels forming the 2*2 matrix, the notch of the driving electrode of each pixel is at a corner of the driving electrode near a center of the 2*2 matrix.

For example, in the microfluidic device provided by an embodiment of the present disclosure, notches of the driving electrodes of the two pixels on the diagonal line are oppositely arranged.

For example, in the microfluidic device provided by an embodiment of the present disclosure, the first substrate further comprises a passivation layer, a first electrode layer and a second electrode layer, the driving electrodes of the two adjacent pixels are respectively in the first electrode layer and the second electrode layer, the first electrode layer, the second electrode layer and the passivation layer are laminated on the base substrate, and the passivation layer is between the first electrode layer and the second electrode layer.

For example, in the microfluidic device provided by an embodiment of the present disclosure, each of the plurality of pixels further comprises a switching circuit, and the switching circuit and the driving electrode of each of the plurality of pixels are electrically connected, correspondingly.

For example, in the microfluidic device provided by an embodiment of the present disclosure, each of the plurality of pixels further comprises a connection portion, and the switching circuit and the driving electrode of each of the plurality of pixels are electrically connected through the connection portion, correspondingly.

For example, in the microfluidic device provided by an embodiment of the present disclosure, the switching circuit comprises a thin film transistor, a first electrode of the thin film transistor is electrically connected to the connection portion, and the connection portion is electrically connected to the driving electrode.

For example, the microfluidic device provided by an embodiment of the present disclosure further comprises a second substrate, and the second substrate faces the first substrate.

For example, the microfluidic device provided by an embodiment of the present disclosure further comprises a common electrode, and the common electrode is on the second substrate.

At least one embodiment of the present disclosure further provides a method of using a microfluidic device, the microfluidic device comprises a first substrate, the first substrate comprises a base substrate and a pixel array, the pixel array comprises a plurality of pixels and is on the base substrate, each of the plurality of pixels comprises a driving electrode, driving electrodes of two adjacent pixels are in different layers, and the method comprises: controlling switching circuits to be turned on, to apply voltages to the driving electrodes of the two adjacent pixels.

For example, in the method provided by an embodiment of the present disclosure, each of the plurality of pixels further comprises a switching circuit, and applying the voltages to the driving electrodes of the two adjacent pixels comprises: controlling switching circuits of the two adjacent pixels to be turned on, to apply the voltages to the driving electrodes of the two adjacent pixels.

For example, in the method provided by an embodiment of the present disclosure, the voltages applied to the driving electrodes of the two adjacent pixels are different from each other.

At least one embodiment of the present disclosure further provides a micro total analysis system, which comprises a microfluidic device, the microfluidic device comprises a first substrate, and the first substrate comprises a base substrate and a pixel array; the pixel array comprises a plurality of pixels and is on the base substrate, and each of the plurality of pixels comprises a driving electrode; and driving electrodes of two adjacent pixels are in different layers.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
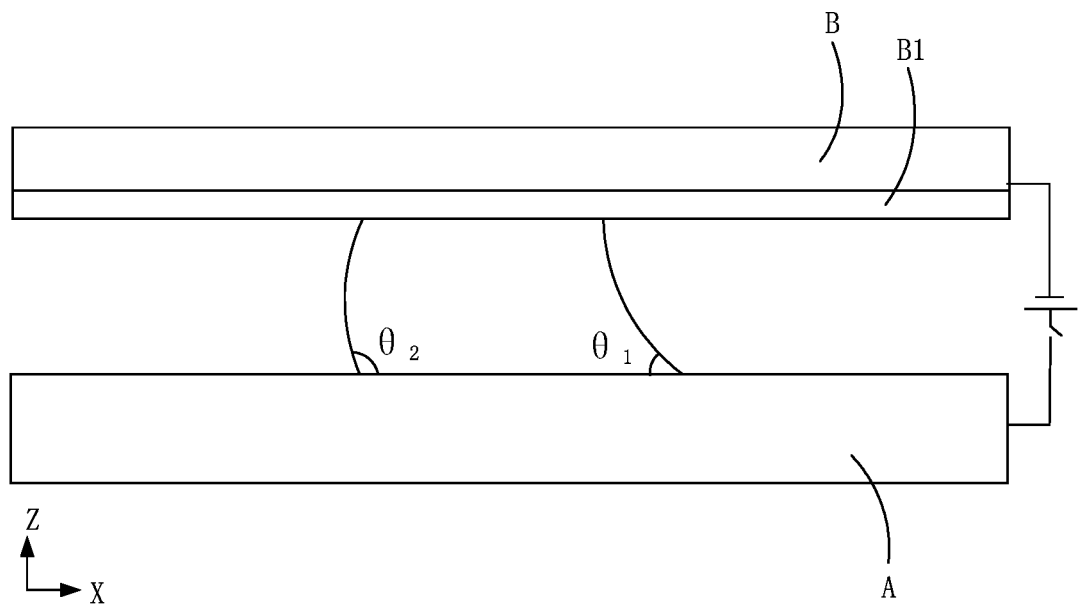
FIG. 1 is a schematic structural diagram of a microfluidic device provided by some embodiments of the present disclosure.

Exemplary embodiments will be described in detail herein, examples of which are illustrated in the accompanying drawings. When the following description refers to the drawings, unless otherwise indicated, the same numbers in different drawings indicate the same or similar elements. The embodiments described in the following exemplary embodiments do not represent all embodiments consistent with this disclosure. On the contrary, they are merely examples of devices consistent with some aspects of the present disclosure as detailed in the appended claims.

The terminology used in the present disclosure is for the purpose of describing particular embodiments only and is not intended to limit the present disclosure. Unless otherwise determined, technical or scientific terms used in this disclosure shall have the ordinary meaning understood by those with ordinary skills in the field to which the present disclosure belongs. The words "first," "second," and the like used in this disclosure and the claims do not denote any order, quantity, or importance, but rather are used to distinguish between different components. Similarly, similar words such as "one" or "a" do not denote a limitation of quantity, but rather denote the presence of at least one. "Multiple" or "Several" means two or more. Similar words such as "include" or "comprise" mean that the elements or items listed before "include" or "comprise" now cover the elements or items listed after "include" or "comprise" and their equivalents, and do not exclude other elements or items. Similar words such as "connected" or "connect" are not limited to physical or mechanical connections, but may include electrical connections, whether direct or indirect. As used in this disclosure and the appended claims, the singular forms "a," "said," and "the" are also intended to include the plural forms unless the context clearly indicates other meanings. It should also be understood that the term "and/or" as used herein refers to and includes any or all possible combinations of one or more associated listed items.

In common microfluidic devices, a thin film transistor in a pixel drives an electrode to apply a voltage to the electrode, and the voltage applied to the electrode causes different contact angles between a droplet and a contact surface, so that the droplet can be moved to a designated position. Vertical light with different wavelengths which is separated from a light source through an optical waveguide emits out from the designated position. A photosensitive sensor determines the position and composition of the droplet by detecting the light passing through the droplet.

However, pitches may exist between the driving electrodes of adjacent pixels. In the structure of ultra-high pixels (e.g., 1,000 PPI (pixel per inch)), the width of the pitch is about 25.4 μm, so the ratio of the pitch is relatively large. Since there is no electric field at the pitch position, the pitch position may affect the effect of movement or separation when micro-fine droplets move or separate.

At least one embodiment of the present disclosure provides a microfluidic device, a method of using a microfluidic device, and a micro total analysis system. In the microfluidic device, by arranging driving electrodes of two adjacent pixels in different layers, pitches between the driving electrodes of the two adjacent pixels can be reduced or even eliminated, thereby ensuring the continuity of the electric field, being beneficial to control the movement and separation of droplets, and improving the control precision.

Figure 2:
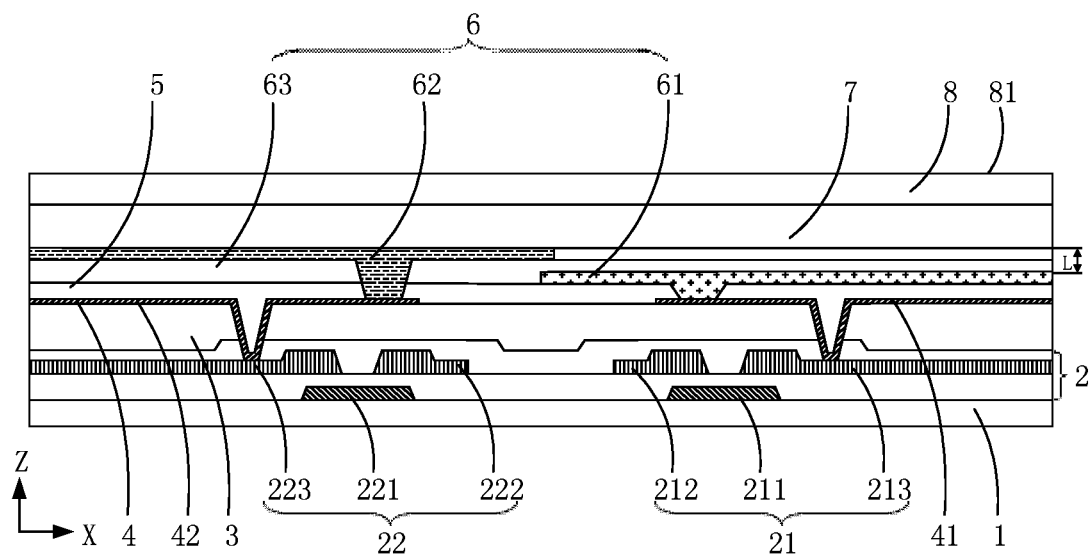
FIG. 2 is a schematic cross-sectional view of a first substrate of a microfluidic device provided by some embodiments of the present disclosure.

Referring to FIG. 1 and FIG. 2, the microfluidic device provided by the embodiments of the present disclosure comprises a first substrate A and a second substrate B, and the first substrate A and the second substrate B are arranged facing to each other and arranged along a longitudinal direction Z. A plurality of driving electrodes (which are described in detail later) are arranged on the first substrate A, and a common electrode B1 is arranged on the second substrate B. After a voltage is applied to the driving electrodes on the first substrate A and the common electrode B1 on the second substrate B, an electric field is formed between the driving electrodes and the common electrode B1, so that a contact angle (the contact angle can be defined by YANG'S equation, e.g., $\theta_1$) between an end of the droplet and a contact surface of the first substrate A changes, while a contact angle at the other end of the droplet (e.g., $\theta_2$) remains unchanged, and the asymmetric deformation of the droplet generates an internal pressure difference, thereby driving the droplet to enable the droplet to perform movement.

Figure 5:
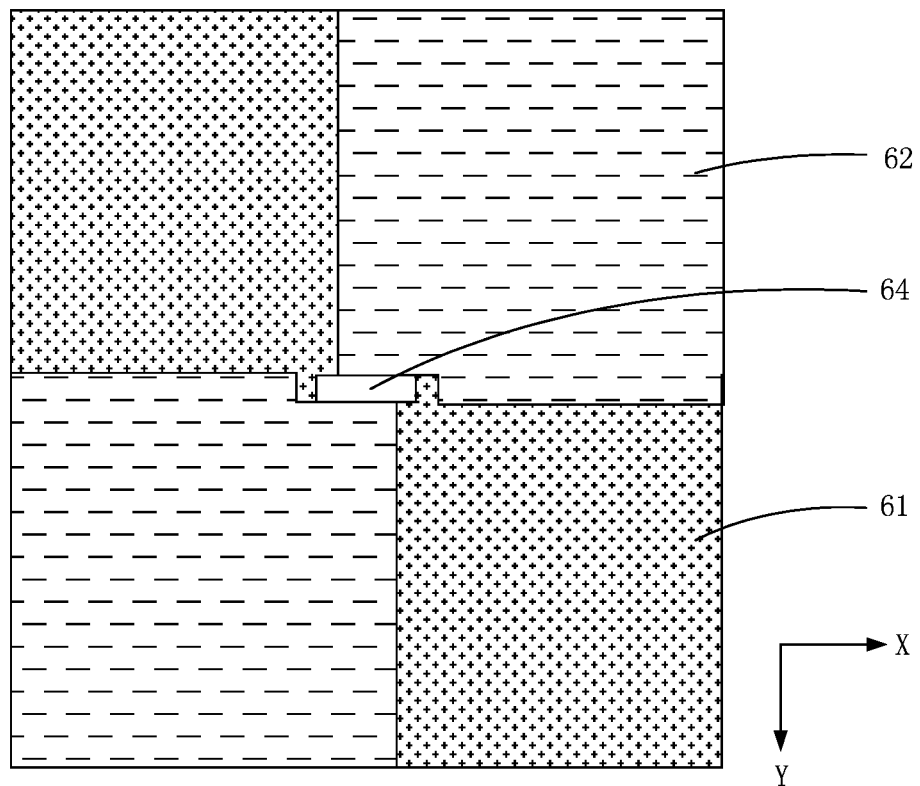
FIG. 5 is a schematic plan view of driving electrodes of four pixels forming a 2*2 matrix of the microfluidic device as illustrated in FIG. 2.

For example, as illustrated in FIG. 2, the first substrate A includes a base substrate 1 and a pixel array formed on the base substrate 1, and the pixel array includes a plurality of pixels. Each of the plurality of pixels includes a switching circuit (for example, a thin film transistor) and a driving electrode, and the switching circuit is electrically connected to the driving electrode correspondingly. Driving electrodes of two adjacent pixels are in different layers. For example, the plurality of pixels of the pixel array are arranged in a plurality of rows and a plurality of columns (for example, as illustrated in FIG. 5, only four pixels are illustrated in FIG. 5, but this does not constitute a limitation to the embodiments of the present disclosure). Driving electrodes of two adjacent pixels in each row are in different layers, and driving electrodes of two adjacent pixels in each column are also in different layers. That is, in each row or column, a plurality of pixels can be divided into a plurality of first pixels located in odd positions and a plurality of second pixels located in even positions according to their positions in the pixel array, and the first pixels and the second pixels are in alternate permutation. For example, each of the plurality of pixels also includes a connection portion, and the switching circuit and the driving electrode of each pixel are electrically connected to each other through the connection portion, correspondingly. For example, in some examples, the switching circuit includes a thin film transistor, a first electrode of the thin film transistor is electrically connected to the connection portion, and the connection portion is electrically connected to the driving electrode. For example, FIG. 2 illustrates two adjacent pixels, i.e., a first pixel and a second pixel, respectively. The first pixel includes a first switching circuit (e.g., a first thin film transistor 21), a first connection portion 41, and a first driving electrode 61, and the second pixel includes a second switching circuit (e.g., a second thin film transistor 22), a second connection portion 42, and a second driving electrode 62.

For example, the base substrate 1 may be a glass substrate or a substrate made of other materials (e.g., plastic, quartz, etc.), and the embodiments of the present disclosure are not limited thereto. For example, the base substrate 1 may be a transparent substrate to facilitate light transmission and facilitate optical detection when the microfluidic device is used in conjunction with an optical detection device.

For example, a drive circuit layer 2 is disposed on the base substrate 1, and the drive circuit layer 2 includes the aforementioned thin film transistor. For example, in some examples, for a certain row or column of pixels, the drive circuit layer 2 is provided with a plurality of first thin film transistors 21 (located in odd positions) and a plurality of second thin film transistors 22 (located in even positions). The first thin film transistors 21 and the second thin film transistors 22 are arranged in sequence along a row direction or a column direction (e.g., a first direction X or a second direction Y) for controlling whether to apply a voltage to the driving electrode. For example, the drive circuit layer 2 may also include other thin film transistors (not illustrated in the figure), which may be used to control whether a detection signal of a photosensitive sensor is collected to realize the optical detection function for droplets. The description of the optical detection using the photosensitive sensor may refer to the conventional design and is not described in detail here. For example, as illustrated in FIG. 2, the first thin film transistor 21 includes a first gate electrode 211, a first source electrode 212, and a first drain electrode 213, and the second thin film transistor 22 includes a second gate electrode 221, a second source electrode 222, and a second drain electrode 223. Of course, the first thin film transistor 21 and the second thin film transistor 22 also include an active layer, a gate insulating layer and the like, respectively, which are not illustrated in the figure, and the arrangement method thereof may refer to a conventional design and is not described in detail here. For example, amorphous silicon, polycrystalline silicon and the like can be selected as main materials for the active layer, and for example, inorganic or organic insulating materials can be used for the gate insulating layer.

A flat layer 3 is an insulating layer that provides a flat surface and is formed on the drive circuit layer 2. The flat layer 3 may be formed of at least one of acrylic resin, epoxy resin, phenolic resin, polyamide resin, polyimide resin, unsaturated polyester resin, polyphenylene sulfide resin, and the like. The embodiments of the present disclosure include but are not limited to this.

A metal layer 4 is formed on the flat layer 3 and includes a plurality of first connection portions 41 and a plurality of second connection portions 42, for establishing electrical connection between the thin film transistor and corresponding driving electrode (e.g., the thin film transistor and the driving electrode in a same pixel). For example, a first electrode of the thin film transistor is electrically connected to the connection portion, and the connection portion is electrically connected to the driving electrode, thus realizing the electrical connection between the thin film transistor and the driving electrode. For example, the first source electrode 212 or the first drain electrode 213 may serve as the first electrode of the first thin film transistor 21, and the second source electrode 222 or the second drain electrode 223 may serve as the first electrode of the second thin film transistor 22. For example, the first connection portion 41 and the second connection portion 42 are electrically connected to the first source electrode 212 (or the first drain electrode 213) and the second source electrode 222 (or the second drain electrode 223) through contact holes in the flat layer 3, respectively.

An insulating layer 5 is formed on the metal layer 4 and may be made of organic insulating material or inorganic insulating material.

For example, a first electrode layer, a passivation layer 63, and a second electrode layer are sequentially laminated on the insulating layer 5, and the passivation layer 63 is between the first electrode layer and the second electrode layer. Driving electrodes of some pixels are in the first electrode layer, while driving electrodes of other pixels are in the second electrode layer. For example, the driving electrodes of two adjacent pixels are respectively in the first electrode layer and the second electrode layer. For example, as illustrated in FIG. 2, the first electrode layer includes a plurality of first driving electrodes 61 formed on the insulating layer 5. The first driving electrodes 61 are, for example, located at odd positions (1, 3, 5, 7, 9 . . . along the first direction X or the second direction Y) and are electrically connected to corresponding first connection portions 41 through contact holes in the insulating layer 5, thereby being electrically connected to the first source electrode 212 (or the first drain electrode 213) of the first thin film transistor 21. Alternatively, a first electrode film layer may be formed on the insulating layer 5, and the first driving electrodes 61 may be formed after patterning. A material of the first driving electrodes 61 may be, for example, indium tin oxide (ITO), indium zinc oxide (IZO), indium tin zinc oxide (ITZO), zinc oxide, tin oxide, etc., and the embodiments of the present disclosure are not limited thereto. The plurality of first driving electrodes 61 are spaced apart from each other, that is, have pitches to avoid short circuit.

The passivation layer 63 serves as an insulating layer and is formed on the first electrode layer, and for example, may be made of inorganic materials such as silicon oxide and silicon nitride, and may be formed of a single layer or multiple layers.

The second electrode layer includes a plurality of second driving electrodes 62 and is formed on the passivation layer 63. The second driving electrodes 62 are, for example, located in even positions (2, 4, 6, 8, 10 . . . along the first direction X or the second direction Y). The second driving electrodes 62 are electrically connected to the corresponding second connection portions 42 through contact holes in the passivation layer 63 and the insulating layer 5, thereby being electrically connected to the second source electrode 222 (or the second drain electrode 223) of the second thin film transistor 22. Alternatively, a second electrode film layer may be formed on the passivation layer 63, and the second driving electrodes 62 may be formed after patterning. A material of the second driving electrodes 62 is similar to that of the first driving electrodes 61. The plurality of second driving electrodes 62 are spaced apart from each other, that is, have pitches to avoid short circuit.

In this way, the first driving electrodes 61 of the first pixels are in a same layer (i.e., the first electrode layer), the second driving electrodes 62 of the second pixels are in a same layer (i.e., the second electrode layer), and the first driving electrodes 61 and the second driving electrodes 62 are in different layers, i.e., the driving electrodes of the two adjacent pixels are in different layers. For example, in four pixels forming a 2*2 matrix, driving electrodes of two pixels on the diagonal line are in a same layer. In this embodiment, the driving electrodes of the four pixels forming the 2*2 matrix as illustrated in FIG. 5, namely, two first driving electrodes 61 and two second driving electrodes 62, are described as an example. The two first driving electrodes 61 are on a diagonal line of the matrix and in a same layer, the two second driving electrodes 62 are on the other diagonal line of the matrix and in a same layer, and the first driving electrodes 61 and the second driving electrodes 62 are in different layers.

Figure 3:
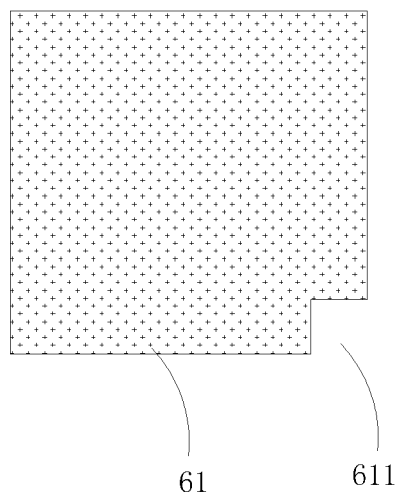
FIG. 3 is a schematic plan view of a driving electrode of a first pixel of the microfluidic device as illustrated in FIG. 2.
Figure 4:
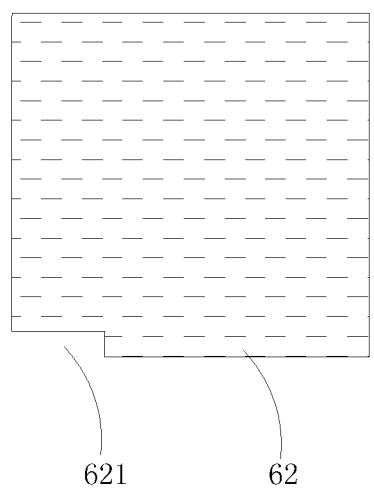
FIG. 4 is a schematic plan view of a driving electrode of a second pixel of the microfluidic device as illustrated in FIG. 2.

For example, in the four pixels forming the 2*2 matrix, the driving electrode of each pixel has a notch, and the notch is at a corner of the driving electrode near a center of the 2*2 matrix. For example, the notches of the driving electrodes of the two pixels on the diagonal line are oppositely arranged. Referring to FIG. 3, FIG. 4 and FIG. 5, the first driving electrode 61 is provided with a first notch 611 located at the top corner thereof, and the first notch 611 is used to ensure that the first driving electrodes 61 of the two first pixels on the diagonal line are separated from each other (i.e., have a pitch), so as to avoid short circuit. The second driving electrode 62 is provided with a second notch 621 located at the top corner thereof, and the second notch 621 is used for ensuring that there is a pitch between the second driving electrodes 62 of the two second pixels on the diagonal line, so as to avoid short circuit.

Referring to FIG. 2 and FIG. 5, in the first direction X and the second direction Y, orthographic projections of the first driving electrode 61 and the adjacent second driving electrode 62 (i.e., the driving electrodes of the two adjacent pixels) on the base substrate 1 have an overlapping area, thus eliminating the pitch between the first driving electrode 61 and the second driving electrode 62. Therefore, in the first direction X and the second direction Y, most areas are covered with the driving electrodes, thereby ensuring the continuity of the electric field, thus facilitating the driving of droplets. Here, "orthographic projection" refers to a projection on the base substrate 1 in a direction perpendicular to the base substrate 1. In this embodiment, the first direction X, the second direction Y and the longitudinal direction Z are perpendicular to each other.

An insulating region 64 (filled by the passivation layer 63 or an organic layer 7) is formed between the two first driving electrodes 61 and the two second driving electrodes 62 on the diagonal lines. A size of the first notch 611 is not equal to a size of the second notch 621. A projection of the first notch 611 of the first driving electrode 61 and a projection of the second notch 621 of the adjacent second driving electrode 62 on the base substrate 1 at least partially coincide, so that the insulating region 64 can exist and a size thereof is as small as possible. The insulating region 64 can actually be regarded as a portion where the first notch 611 and the second notch 621 coincide.

Referring to FIG. 2, the organic layer 7 is formed on the second electrode layer, and a material is, for example, resin, which can be used as a protective layer for the second electrode layer.

A hydrophobic layer 8 is formed on the organic layer 7, and an upper surface 81 of the hydrophobic layer 8 serves as a contact surface in contact with droplets. The hydrophobic layer 8 may be made of a hydrophobic material such as teflon.

In some embodiments, a continuous common electrode B1 is provided on the second substrate B, and orthographic projections of the driving electrodes of all pixels of the pixel array on the base substrate 1 are located within an orthographic projection of the common electrode B1 on the base substrate 1, so that an electric field can be formed between the common electrode B1 and the driving electrode of each pixel. In this way, the production process can be simplified. For example, in other embodiments, the common electrode B1 provided on the second substrate B includes a plurality of sub-electrodes, and the arrangement of each sub-electrode is similar to the arrangement of the first driving electrode 61 and the second driving electrode 62, so as to form an electric field between each sub-electrode and the driving electrode of each pixel in a one-to-one correspondence, thereby improving the continuity of the electric field. It should be noted that in the embodiments of the present disclosure, a structure of the second substrate B may be different from or substantially the same as that of the first substrate A, and the embodiments of the present disclosure are not limited thereto.

Figure 6:
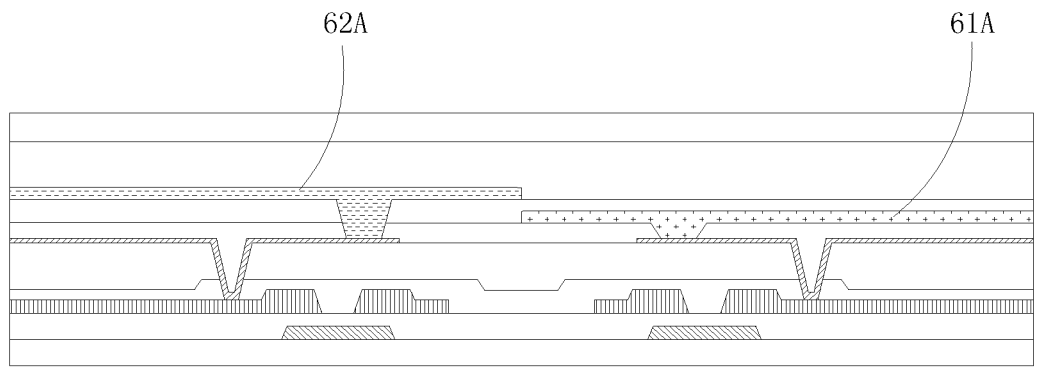
FIG. 6 is a schematic cross-sectional view of a first substrate of another microfluidic device provided by some embodiments of the present disclosure.

Referring to FIG. 6, in another embodiment of the present disclosure, orthographic projections of a first driving electrode 61A and an adjacent second driving electrode 62A (i.e., the driving electrodes of the two adjacent pixels) on the base substrate 1 are connected at an adjacent edge, that is, an edge of the orthographic projection of the first driving electrode 61A is in contact with an edge of the orthographic projection of the second driving electrode 62A, and since there is no pitch, good continuity of the electric field can also be ensured. Other structures of the microfluidic device are basically the same as those of the embodiments as illustrated in FIG. 1 and FIG. 2, and are not described one by one.

Figure 8:
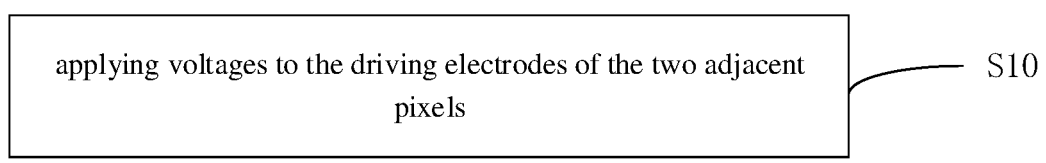
FIG. 8 is a flow chart of a method of using a microfluidic device provided by some embodiments of the present disclosure.

At least one embodiment of the present disclosure also provides a method of using a microfluidic device, which can be used for the microfluidic device described in any embodiments of the present disclosure. For example, in some examples, as illustrated in FIG. 8, the method includes following operations.

Step S10: applying voltages to the driving electrodes of the two adjacent pixels.

For example, in some embodiments, each of the plurality of pixels further comprises a switching circuit, and applying the voltages to the driving electrodes of the two adjacent pixels (i.e., step S10) comprises: controlling switching circuits of the two adjacent pixels to be turned on, to apply the voltages to the driving electrodes of the two adjacent pixels.

Thus, the droplets can move under the action of the electric field. The technical effect of this method may be referred to the above description of the microfluidic device, which is not repeated here.

Since the first driving electrode 61 (or 61A) and the second driving electrode 62 (or 62A) have a certain positional difference in the longitudinal direction Z, a distance between the first driving electrode 61 and the common electrode B1 is larger than a distance between the second driving electrode 62 and the common electrode B1. In a case where a same voltage is applied to the first driving electrode 61 and the second driving electrode 62, an electric field value in the region between the first driving electrode 61 and the common electrode B1 is smaller, while an electric field value in the region between the second driving electrode 62 and the common electrode B1 is larger. Therefore, in the embodiments of the present disclosure, the voltages applied to the driving electrodes of two adjacent pixels can be different from each other. For example, the first thin film transistor 21 in the drive circuit layer 2 is controlled to be turned on to apply a first voltage to the first driving electrode 61, and the second thin film transistor 22 in the drive circuit layer 2 is controlled to be turned on to apply a second voltage to the second driving electrode 62, and the second voltage is smaller than the first voltage, so as to ensure that the electric field value of the region between the first driving electrode 61 and the common electrode B1 is substantially equal to or has a small difference with the electric field value of the region between the second driving electrode 62 and the common electrode B1, thereby improving the control precision of droplet movement.

For example, the specific values of the first voltage and the second voltage and the relationship between the two can be calculated by using the U=Ed calculation formula according to the height difference L between the first driving electrode 61 and the second driving electrode 62 along the longitudinal direction Z, where d is the distance between the driving electrode and the common electrode B1, E is the electric field value, and U is the voltage applied.

Of course, the method of using the microfluidic device may also include other steps, such as controlling the switching circuit to be turned on or turned off, controlling the voltage to change, etc., which are not described in detail in this embodiment.

Figure 7:
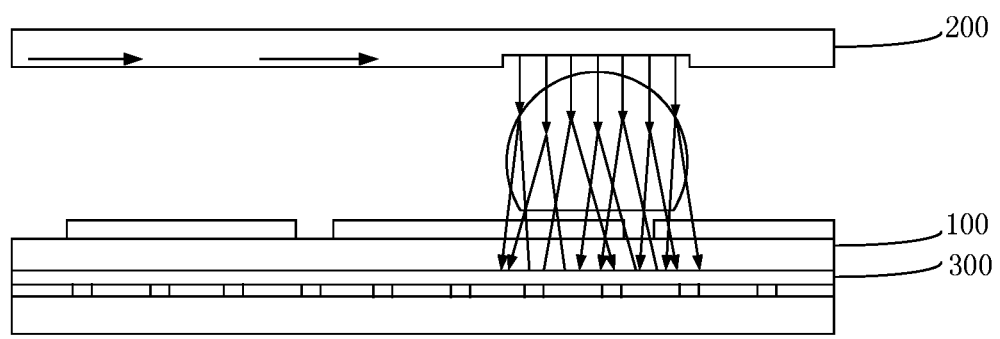
FIG. 7 is a schematic structural diagram of a micro total analysis system provided by some embodiments of the present disclosure.

In addition, at least one embodiment of the present disclosure also provides a micro total analysis system, which comprises a microfluidic device, and the microfluidic device is the microfluidic device according to any one of the embodiments of the present disclosure. Referring to FIG. 7, the micro total analysis system includes a microfluidic device 100 which is described in the above embodiments, an optical waveguide device 200, a testing device 300, and the like. The optical waveguide device 200 may include a plurality of different light sources to output light of different wavelengths. The microfluidic device 100 is used to drive droplets to move, mix or split. The testing device 300 may include, for example, a photosensitive sensor, which may test the droplet position, or may perform a transmittance fine test (e.g., a concentration test). In some embodiments, the microfluidic device 100 and the testing device 300 may be integrated, such as integrating the photosensitive sensor on the first substrate A.

In the embodiments of the present disclosure, by arranging the driving electrodes of the two adjacent pixels in different layers, it is beneficial to reduce or even eliminate the pitch between the driving electrodes of the two adjacent pixels, thereby ensuring the continuity of the electric field and being beneficial to control the movement and separation of droplets.

The above description is only for some embodiments of the present disclosure and is not intended to limit the present disclosure. Any modifications, equivalent replacement, improvements, etc. made within the spirit and principles of the present disclosure shall be included within the scope of protection of the present disclosure.

The above description is only specific embodiments of the present disclosure, but the scope of protection of the present disclosure is not limited thereto, and the scope of protection of the present disclosure shall be subject to the scope of protection of the claims.

What is claimed is:

1. A microfluidic device, comprising a first substrate, the first substrate comprising:
   a base substrate; and
   a pixel array on the base substrate, comprising a plurality of pixels, each of the plurality of pixels comprising a driving electrode,
   wherein the first substrate further comprises a plurality of electrode layers, different electrode layers have different distances from the base substrate, a distance between an electrode layer of the plurality of electrode layers and the base substrate is a distance between an upper-most horizontal plane of the electrode layer and an upper-most horizontal plane of the base substrate along a vertical direction, and driving electrodes of two adjacent pixels are in different electrode layers;
   orthographic projections of the driving electrodes of the two adjacent pixels on the base substrate have an overlapping area, or the orthographic projections of the driving electrodes of the two adjacent pixels on the base substrate have an overlapping edge.

2. The microfluidic device according to claim 1, wherein the plurality of pixels of the pixel array are arranged in a plurality of rows and a plurality of columns,
   driving electrodes of two adjacent pixels in each row are in different electrode layers, and
   driving electrodes of two adjacent pixels in each column are in different electrode layers.

3. The microfluidic device according to claim 2, wherein, in four pixels forming a 2*2 matrix, driving electrodes of two pixels on a diagonal line are in a same electrode layer.

4. The microfluidic device according to claim 3, wherein the driving electrodes of the two pixels on the diagonal line have a pitch.

5. The microfluidic device according to claim 4, wherein the driving electrode of each of the plurality of pixels has a notch, and orthographic projections of notches of the driving electrodes of the two adjacent pixels on the base substrate at least partially coincide.

6. The microfluidic device according to claim 5, wherein sizes of the notches of the driving electrodes of the two adjacent pixels are not equal.

7. The microfluidic device according to claim 5, wherein, in the four pixels forming the 2*2 matrix, the notch of the driving electrode of each pixel is at a corner of the driving electrode near a center of the 2*2 matrix.

8. The microfluidic device according to claim 7, wherein notches of the driving electrodes of the two pixels on the diagonal line are oppositely arranged.

9. The microfluidic device according to claim 1, wherein the first substrate further comprises a passivation layer, and the plurality of electrode layers comprise a first electrode layer and a second electrode layer, the driving electrodes of the two adjacent pixels are respectively in the first electrode layer and the second electrode layer, the first electrode layer, the second electrode layer and the passivation layer are laminated on the base substrate, and the passivation layer is between the first electrode layer and the second electrode layer.

10. The microfluidic device according to claim 1, wherein each of the plurality of pixels further comprises a switching circuit, and the switching circuit and the driving electrode of each of the plurality of pixels are electrically connected, correspondingly.

11. The microfluidic device according to claim 10, wherein each of the plurality of pixels further comprises a connection portion, and the switching circuit and the driving electrode of each of the plurality of pixels are electrically connected through the connection portion, correspondingly.

12. The microfluidic device according to claim 11, wherein the switching circuit of each of the plurality of pixels comprises a thin film transistor, a first electrode of each thin film transistor is electrically connected to a corresponding connection portion, and the corresponding connection portion is electrically connected to a corresponding driving electrode.

13. The microfluidic device according to claim 1, further comprising a second substrate, wherein the second substrate faces the first substrate.

14. The microfluidic device according to claim 13, further comprising a common electrode, wherein the common electrode is on the second substrate.

15. A method of using a microfluidic device, the microfluidic device comprising a first substrate, the first substrate comprising a base substrate and a pixel array, the pixel array comprising a plurality of pixels and being on the base substrate, each of the plurality of pixels comprising a driving electrode, the first substrate further comprising a plurality of electrode layers, different electrode layers having different distances from the base substrate, a distance between an electrode layer of the plurality of electrode layers and the base substrate being a distance between an upper-most horizontal plane of the electrode layer and an upper-most horizontal plane of the base substrate along a vertical direction, and driving electrodes of two adjacent pixels being in different electrode layers, orthographic projections of the driving electrodes of the two adjacent pixels on the base substrate having an overlapping area or the orthographic projections of the driving electrodes of the two adjacent pixels on the base substrate having an overlapping edge, wherein the method comprises:
applying voltages to the driving electrodes of the two adjacent pixels.

16. The method according to claim 15, wherein each of the plurality of pixels further comprises a switching circuit, and applying the voltages to the driving electrodes of the two adjacent pixels comprises:

controlling switching circuits of the two adjacent pixels to be turned on, to apply the voltages to the driving electrodes of the two adjacent pixels.

17. The method according to claim 15, wherein the voltages applied to the driving electrodes of the two adjacent pixels are different from each other.

18. A micro total analysis system, comprising a microfluidic device, wherein the microfluidic device comprises a first substrate, and the first substrate comprises a base substrate and a pixel array;

the pixel array comprises a plurality of pixels and is on the base substrate, and each of the plurality of pixels comprises a driving electrode; and the first substrate further comprises a plurality of electrode layers, different electrode layers have different distances from the base substrate, a distance between an electrode layer of the plurality of electrode layers and the base substrate is a distance between an upper-most horizontal plane of the electrode layer and an upper-most horizontal plane of the base substrate along a vertical direction, and driving electrodes of two adjacent pixels are in different electrode layers;

orthographic projections of the driving electrodes of the two adjacent pixels on the base substrate have an overlapping area or the orthographic projections of the driving electrodes of the two adjacent pixels on the base substrate have an overlapping edge.

* * * * *